US012791594B2

(12) United States Patent
Reitz et al.

(10) Patent No.: US 12,791,594 B2
(45) Date of Patent: Nov. 10, 2026

(54) ELECTRIC MEASURING ARRANGEMENT AND MEASURING METHOD FOR A GROUND CONNECTION MONITORING SYSTEM FOR AN INSULATION MONITORING DEVICE AND INSULATION MONITORING DEVICE

(71) Applicant: Bender GmbH & Co. KG, Gruenberg (DE)

(72) Inventors: Julian Reitz, Gruenberg (DE); Oliver Schaefer, Gruenberg (DE); Simon Weber, Nidda (DE)

(73) Assignee: Bender GmbH & Co. KG, Gruenberg (DE)

( * ) Notice: Subject to any disclaimer, the term of this patent is extended or adjusted under 35 U.S.C. 154(b) by 0 days.

(21) Appl. No.: 19/222,580

(22) Filed: May 29, 2025

(65) Prior Publication Data

US 2025/0370017 A1 Dec. 4, 2025

(30) Foreign Application Priority Data

May 29, 2024 (DE) ..................... 10 2024 115 040.8

(51) Int. Cl.
*G01R 27/02* (2006.01)
*G01R 27/20* (2006.01)

(52) U.S. Cl.
CPC ........... *G01R 27/025* (2013.01); *G01R 27/20* (2013.01)

(58) Field of Classification Search
CPC G01R 31/12; G01R 31/1272; G01R 19/2513; G01R 31/14; G01R 19/0092;
(Continued)

(56) References Cited

U.S. PATENT DOCUMENTS 4,180,411 A * 12/1979 Whitman ................. B01J 21/04 501/83
4,546,309 A * 10/1985 Kang ................... G01R 31/086 324/529
(Continued)

FOREIGN PATENT DOCUMENTS

CN 106816856 A 6/2017
CN 110456151 A 11/2019
(Continued)

*Primary Examiner* — Vinh P Nguyen
(74) *Attorney, Agent, or Firm* — Dickinson Wright PLLC; Andrew D. Dorisio

(57) ABSTRACT

An electric measuring arrangement (10) and a measuring method are provided, both for monitoring a ground connection for an insulation monitoring device (4), which is connected to at least one active conductor (L1, L2) of an ungrounded power supply system (2) and a ground terminal (PE) of an electric installation (3), with an active loop measurement device (20), which is connectable between a ground-connection clamp (E) of the insulation monitoring device (4) and the ground terminal (PE) and has an independent excitation voltage source ($U_{gEKE}$) for quantitatively determining a ground resistance ($R_{EKE}$) of the ground connection (6) between the insulation monitoring device (4) and the ground terminal (PE). Further is provided an insulation monitoring device having the electric measuring arrangement (10).

9 Claims, 2 Drawing Sheets

(58) Field of Classification Search
CPC .... G01R 31/08; G01R 31/083; G01R 31/081; G01R 31/1245; G01R 31/52; G01R 27/025; G01R 27/20; G01R 27/205; G01R 31/66; G01N 22/02
See application file for complete search history.

(56) References Cited

U.S. PATENT DOCUMENTS

| | | | | |
|---|---|---|---|---|
| 6,538,450 | B2 * | 3/2003 | Bussinger | G01R 31/083 324/516 |
| 10,784,674 | B2 * | 9/2020 | Hackl | H02H 3/162 |
| 2013/0088240 | A1 | 4/2013 | Hofheinz | |
| 2021/0096167 | A1 | 4/2021 | Moell et al. | |
| 2021/0255225 | A1 | 8/2021 | Broeckmann | |
| 2025/0172595 | A1 * | 5/2025 | Hackl | G01R 27/025 |

FOREIGN PATENT DOCUMENTS

| | | | |
|---|---|---|---|
| CN | 110726877 | A | 1/2020 |
| CN | 210690686 | U | 6/2020 |
| CN | 112858785 | A | 5/2021 |
| CN | 214335062 | U | 10/2021 |
| CN | 113834956 | A | 12/2021 |
| CN | 117441107 | A | 1/2024 |
| DE | 4339346 | A1 | 5/1995 |
| DE | 102012019094 | A1 | 3/2014 |
| DE | 102012019095 | A1 | 3/2014 |
| DE | 102017209243 | A1 | 12/2018 |
| EP | 4242674 | A1 | 9/2023 |
| EP | 4435443 | A1 | 9/2024 |

* cited by examiner

State of the Art

ELECTRIC MEASURING ARRANGEMENT AND MEASURING METHOD FOR A GROUND CONNECTION MONITORING SYSTEM FOR AN INSULATION MONITORING DEVICE AND INSULATION MONITORING DEVICE

This application claims priority to German Patent Application No. 10 2024 115 040.8 filed on May 29, 2024, the disclosure of which is hereby incorporated by reference.

TECHNICAL FIELD

The invention relates to an electric measuring arrangement and a measuring method for a ground connection monitoring system for an insulation monitoring device which is connected to at least one active conductor of an ungrounded power supply system and to a ground terminal of an electric installation.

DESCRIPTION

The invention also relates to an insulation monitoring device which is connectable to at least one active conductor of an ungrounded power supply system and a ground terminal of an electric installation in order to monitor an insulation resistance of the ungrounded power supply system.

Where there are increased requirements for the operational, fire and contact safety of electric installations, the network configuration of an ungrounded power supply system is used, which is also referred to as an isolated network (French: "isolé terre"—IT) or IT power supply system. In this type of power supply system, the active parts of the power supply system are isolated from the ground potential—to ground. The bodies of the connected electric consumers are grounded individually or together. The advantage of these networks is that in the event of a first insulation fault, the function of the connected electric consumers is not impaired and therefore continued operation is possible despite the faulty state of the insulation, as no closed circuit can form due to the ideally infinite electric resistance (insulation resistance) between an active conductor of the network and ground potential.

The insulation resistance of the ungrounded power supply system must therefore be constantly monitored, as a possible further fault (insulation fault) on another active conductor would result in a fault loop and the fault current flowing in conjunction with an overcurrent protection device would result in the installation being switched off with an operational standstill.

Insulation monitoring devices (IMDs) are used to monitor the insulation resistance. Active insulation monitoring devices known from the state of the art are connected between the active conductors on the one hand and ground on the other and superimpose a preferably pulse-shaped measuring voltage (measuring pulses) on the network. If an insulation fault occurs, the measuring circuit between the network and ground closes via the insulation fault, meaning a measuring current proportional to the insulation fault is established. This measuring current causes a corresponding voltage drop at a measuring resistor in the insulation monitoring device, the voltage drop being evaluated by the electronics and triggering an alarm if a presettable limit value is exceeded.

There are also passive monitoring devices (ground fault monitors) which can only identify asymmetrical insulation faults using voltage measurement methods such as the 3-voltmeter method.

In all cases of insulation monitoring, the contacting of the ground connection via the ground-connection clamp of the insulation monitoring device with the ground terminal (ground potential) must be ensured by minimum contact resistances when determining the insulation resistance. To ensure proper functioning of the insulation monitoring device, it is therefore necessary to permanently monitor the low-impedance connection (ground connection) of the insulation monitoring device to the ground potential in order to be able to issue a message in the event of deterioration or complete loss of the ground connection.

A regulation on the ground connection monitoring system can be found, for example, in the standard DIN EN 61557-8:2015, Annex Chapter A.4.2.2 "Testing the function of an indication of the interruption of the connection to the monitored system". Accordingly, the indication for the loss of the ground connection and the loss of the connection to the network to be monitored must be checked. A message must be issued if the ground connection or the network connection or both connections together are interrupted.

According to the state of the art, insulation monitoring devices are available on the market which are able to detect a drop in the insulation resistance or an interruption of the ground connection due to their single-pole coupling to the ground potential, but cannot determine whether the resistance value measured by the insulation monitoring device is the actual insulation resistance of the ungrounded power supply system to ground or is due to a faulty ground connection, since the connection in the measuring circuit is a series connection of the resistors involved.

Insulation monitoring devices which have a second ground-connection clamp and detect an interruption in the ground connection by passively measuring the measuring voltage supplied by the insulation monitoring device are also known from the state of the art.

However, all known insulation monitoring devices only make a binary distinction in a "hard" I/O decision between a good and a bad condition of the ground connection—it is not intended to quantitatively determine the ground resistance of the ground connection, meaning the triggering of an alarm for an insulation resistance is always associated with a probability of error.

In the case of active insulation monitoring devices, it is also not known how to determine the ground resistance independently of the measuring voltage of the insulation monitoring device.

SUMMARY

The object of the invention is therefore to design an electric measuring arrangement and a method which both enable reliably monitoring the ground connection for both active as well as passive insulation monitoring devices and for an active and inactive measuring voltage.

This object is attained by an active loop measurement device, which is connectable between a ground-connection clamp of the insulation monitoring device and the ground terminal and has an independent excitation voltage source for quantitatively determining a ground resistance of the ground between the insulation monitoring device and the ground terminal.

The fundamental idea of the present invention is based on determining the ground resistance of the ground connection by means of an independent measuring arrangement which is independent of the measuring voltage of the insulation monitoring device. For this purpose, the measuring arrangement is designed as an active loop measurement device having an independent excitation voltage source and is thus able to reliably monitor the ground connection even when the measurement pulse of the insulation monitoring device is inactive or when the insulation monitoring device is passive.

The measuring arrangement is connected to the ground-connection clamp of the insulation monitoring device on the one hand and the ground terminal (PE) on the other hand and enables quantitatively determining the ground resistance of the ground connection between the insulation monitoring device and the ground terminal by means of a "soft" decision. In this manner, the quality (continuity) of the ground connection can be assessed in stages, thus ensuring that the insulation monitoring device provides reliable results, particularly for alarm thresholds in the low-impedance measuring range.

It is also easier to react to any interference signals by adjusting the frequency or signal shape, independently of the measurement technology used for the actual insulation monitoring. Another advantage is that quantifying the ground resistance makes it possible to adapt the alarm thresholds for the ground connection monitoring system to customer requirements.

In addition, the development of insulation monitoring devices overcomes the frequent difficulty of having to equate the circuit reference potential with the ground potential due to external factors.

In a further embodiment, the loop measurement device has a series connection comprising the excitation voltage source for superimposing an excitation signal, a loop measuring resistance, a loop coupling resistance, a test and filter circuit which detects a loop measuring voltage between the loop measuring resistance and the loop coupling resistance, a microcontroller which evaluates the loop measuring voltage for computing the ground resistance, and a control-ground connection clamp for connecting the loop couple resistance to the ground terminal.

The active loop measurement device consists of a series connection between the control-ground connection clamp of the insulation monitoring device and a control-ground-connection clamp, which is connected to the ground terminal.

The functional elements of the series connection include the excitation voltage source, a loop measurement resistance and a loop coupling resistance, a test and filter circuit and a microcontroller.

Since line and contact resistances (transition resistances) are present both from the ground-connection clamp of the insulation monitoring device and from the control-ground connection clamp of the loop measurement device provided in accordance with the invention, a resistive current loop is formed via the ground terminal and via the control-ground connection clamp. The current flowing in this loop is driven by the excitation voltage superimposed by the excitation voltage source independently of the network voltage and of the measuring voltage of the insulation monitoring device. The microcontroller computes the ground resistance of the ground connection between the insulation monitoring device and the ground terminal based on the loop measurement resistance and the loop coupling resistance as well as with the loop measuring voltage detected by the test and filter circuit.

Preferably, the excitation voltage is a bipolar square wave voltage having a base frequency ranging from 0.1 Hz to 10 Hz and a voltage change less than 10 V.

The frequency range from 0.1 Hz to 10 Hz can be separated with sufficient accuracy in the test and filter circuit with low-pass character. In the event of massive interferences from external sources, such as frequency converters, it would be possible in an optimizing manner to switch from the excitation voltage of the excitation voltage source to a sinusoidal mixture of several frequencies by changing the software via the microcontroller. Targeted frequency analysis using DFT/FFT then allows only undisturbed signal components to be used for further analysis.

Due to the influence of the measuring voltage source of the insulation monitoring device which is not synchronized with the excitation voltage source or due to external sources, external DC currents can occur on the ground connection, which could interfere with the measuring method according to the invention. In order to become robust against this, the voltage change of the excitation voltage and the voltage change of the loop measuring voltage are used instead of the absolute levels to compute the ground resistance.

Advantageously, a TVS diode is switched between the ground-connection clamp of the insulation monitoring device and the control-ground connection clamp of the loop measuring device.

By attaching the TVS diode (transient voltage suppressor or suppressor diode) with a breakdown voltage of less than 10 V between the ground-connection clamp and the control-ground connection clamp, the connection via the control-ground connection clamp is able to act as a redundant ground connection. The TVS diode also limits the external DC voltage for the purpose of circuit protection. A response of the TVS diode can be identified by the test and filter circuit in conjunction with the microcontroller and can be evaluated as an impermissible state.

Furthermore, an insulation monitoring device according to the invention is claimed in which a known insulation monitoring device relating to the invention is extended with the electric measuring arrangement according to the invention for the ground connection monitoring system.

In addition to a design of the electric measuring arrangement according to the invention as a discrete structural entity separate from an insulation monitoring device, integration into an insulation monitoring device in the form of a common structural entity is thus also possible.

The function of the electric measuring arrangement according to the invention as described above is based on the measuring method for monitoring the ground connection for an insulation monitoring device as described in the independent method claim. In this respect, the aforementioned technical effects and resulting method advantages also apply to the method features.

BRIEF DESCRIPTION OF THE DRAWINGS

Further advantageous embodiment features are derived from the following description and the drawings, which describe a preferred embodiment of the invention by means of examples.

DETAILED DESCRIPTION

Figure 1:
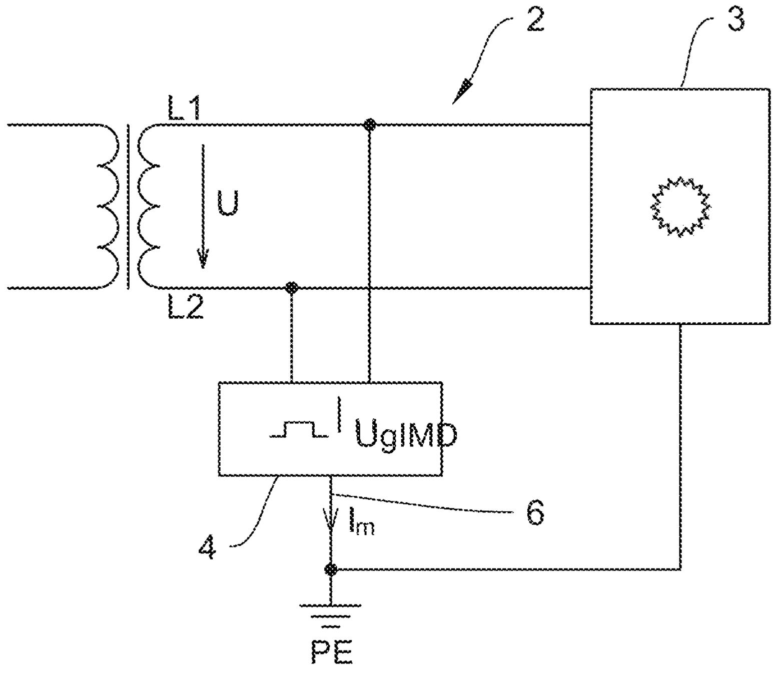
FIG. 1: shows a ground connection monitoring system according to the state of the art.

FIG. 1 shows a ground connection monitoring system according to the state of the art with an insulation monitoring device 4, which is connected to the active conductors L1, L2 of an ungrounded power supply system 2 and to a ground terminal PE of an electric installation 3 via a ground connection 6.

Figure 2:
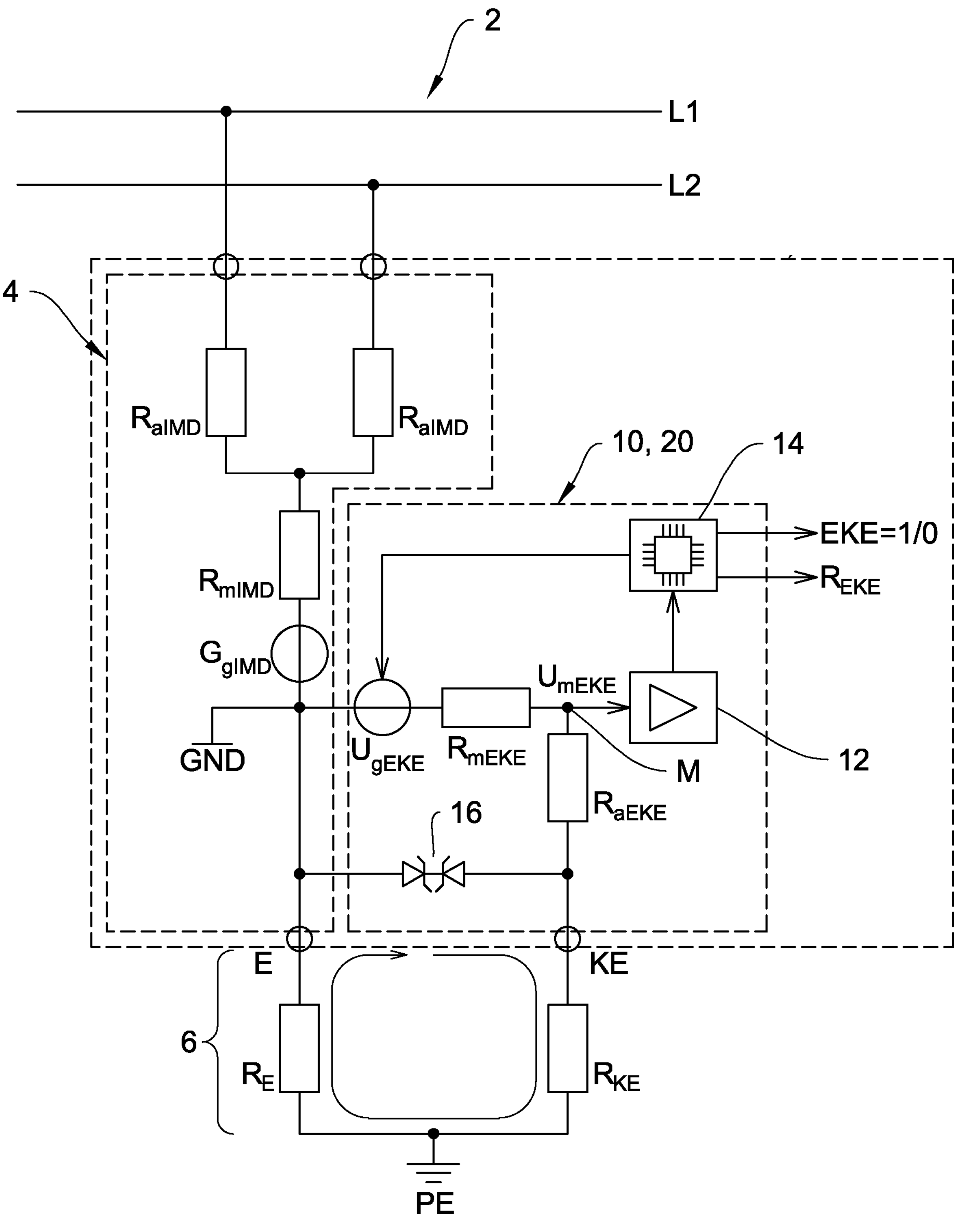
FIG. 2: shows a ground connection monitoring system with an insulation monitoring device and an electric measuring arrangement according to the invention.

FIG. 2 shows a ground connection monitoring system with an insulation monitoring device 4 connected to the ungrounded power supply system 2 and an electric measuring arrangement 10 according to the invention.

The insulation monitoring device 4 is coupled to the active conductors L1, L2 of the ungrounded power supply system 2 via coupling resistances $R_{aIMD}$ and comprises a measuring voltage generator $U_{gIMD}$ for supplying a measuring voltage $U_{gIMD}$ and a measuring resistance $R_{mIMD}$ for measuring a measuring current $I_m$ corresponding to the insulation resistance. The ground-connection clamp E is used to connect the insulation monitoring device 4 having the reference potential GND to the ground terminal PE in order to establish the ground connection 6.

The electric measuring arrangement 10 according to the invention is disposed between the ground-connection clamp E of the insulation monitoring device 4 and a control-ground connection clamp KE. The electric measuring arrangement 10 is designed as an active loop measurement device 20 in the form of a series connection. The series connection comprises an excitation voltage source $U_{gEKE}$, which generates an excitation voltage $U_{gEKE}$. The excitation voltage $U_{gEKE}$ drives a current in a current loop via the ground-connection clamp E and the control-ground connection clamp KE having the contact resistances $R_E$ and $R_{KE}$.

As a result, voltage drop is caused at a loop measurement resistance $R_{mEKE}$, which is detected as loop measuring voltage $U_{mEKE}$ and used to measure the ground resistance $R_{EKE}$.

The measuring point M of the loop measuring voltage $U_{mEKE}$ is connected to the control-ground connection clamp KE via a loop coupling resistance $R_{aEKE}$.

The ground resistance $R_{EKE}$ composed of the transition resistances $R_E$, $R_{KE}$ in the current loop formed via the ground-connection clamp E, the ground terminal PE and the control-ground connection clamp KE can be computed using the current/voltage relationships applicable to linear networks (mesh and node point rule and Ohm's law) as follows $$R_{EKE} = R_E + R_{KE} = \frac{R_{mEKE}}{\left(\frac{\Delta U_{gEKE}}{\Delta U_{mEKE}} - 1\right)} - R_{aEKE}.$$

To make the method more resistant to interference, the voltage change Δ of the excitation voltage $U_{gEKE}$ and the voltage change Δ of the loop measuring voltage $U_{mEKE}$ are included in the computation instead of the absolute values.

To record the loop measuring voltage $U_{mEKE}$ at the measuring point M, an electronic test and filter circuit 12 with low-pass effect and any stages for level adjustment is provided.

The test and filter circuit 12 forwards the measurement result to a microcontroller 14, which evaluates the loop measuring voltage $U_{mEKE}$ to compute the ground resistance $R_{EKE}$ according to the equation above.

The microcontroller 14 has an evaluation algorithm which quantifies the ground resistance $R_{EKE}$ as the resistance value of the loop in the range $R_{EKE}$=0 . . . 2 kΩ. Threshold value $R_{EKEth}$ can be set by software for this purpose. Moreover, the microcontroller 14 can also perform tasks other than loop measurement, e.g., the measurement technology for insulation monitoring in the insulation monitoring device 4 or HMI control.

In FIG. 2, a TVS diode 16 is optionally inserted in a line branch between the ground-connection clamp E of the insulation monitoring device 4 and the control-ground connection clamp KE in order to provide a redundant ground connection.

The invention claimed is:

1. An electric measurement arrangement (10) for a ground connection monitoring system for an insulation monitoring device (4), which is connected to at least one active conductor (L1, L2) of an ungrounded power supply system (2) and to a ground terminal (PE) of an electric installation (3),
comprising: an active loop measurement device (20), which is connectable between a ground-connection clamp (E) of the insulation monitoring device (4) and the ground terminal (PE) and has an independent excitation voltage source ($U_{gEKE}$) for quantitatively determining a ground resistance ($R_{EKE}$) of a ground connection (6) between the insulation monitoring device (4) and the ground terminal (PE).

2. The electric measurement arrangement (10) according to claim 1,
wherein the loop measurement device (20) has a series connection comprising the excitation voltage source ($U_{gEKE}$) for superimposing an excitation voltage ($U_{gEKE}$),
a loop measuring resistance ($R_{mEKE}$),
a loop coupling resistance ($R_{aEKE}$),
a test and filter circuit (12) which detects a loop measuring voltage ($U_{mEKE}$) between the loop measuring resistance ($R_{mEKE}$) and the loop coupling resistance ($R_{aEKE}$),
a microcontroller (14) which evaluates the loop measuring voltage ($U_{mEKE}$) for computing the ground resistance ($R_{EKE}$), and
a control-ground connection clamp (KE) for connecting the loop couple resistance ($R_{aEKE}$) to the ground terminal (PE).

3. The electric measurement arrangement (10) according to claim 2,
wherein the excitation voltage ($U_{gEKE}$) is a bipolar square wave voltage having a base frequency ranging from 0.1 Hz to 10 Hz and a voltage change less than 10 V.

4. The electric measurement arrangement (10) according to claim 2,
wherein a TVS diode (16) is switched between the ground-connection clamp (E) of the insulation monitoring device (4) and the control-ground connection clamp (KE) of the loop measuring device.

5. An insulation monitoring device which is connectable to at least one active conductor (L1, L2) of the ungrounded power supply system (2) and to a ground terminal (PE) of an electric installation (3) in order to monitor an insulation resistance of an ungrounded power supply system (2),
comprising an electric measuring arrangement (10) according to claim 1.

6. A measuring method for monitoring a ground connection for an insulation monitoring device (4), which is connected to at least one active conductor (L1, L2) of an ungrounded power supply system (2) and a ground terminal (PE) of an electric installation (3), comprising: quantitatively determining a ground resistance ($R_{EKE}$) of a ground connection (6) between the insulation monitoring device (4) and the ground terminal (PE) by means of an active loop measuring device (20), which is connectable between a ground-connection clamp (E) of the insulation monitoring device (4) and the ground terminal (PE) and has an independent excitation voltage source ($U_{gEKE}$).

7. A measuring method according to claim 6, wherein the ground resistance ($R_{EKE}$) is quantitatively determined in the loop measuring device (20), which has a series connection comprising the excitation voltage source ($U_{gEKE}$), which is connectable to the ground-connection clamp (E) of the insulation monitoring device (4), a loop measuring resistance ($R_{mEKE}$), a loop coupling resistance ($R_{aEKE}$), a test and filter circuit (12) having a voltage tap between the loop measuring resistance ($R_{mEKE}$) and the loop coupling resistance ($R_{aEKE}$), a microcontroller (14), and a control-ground connection clamp (KE) for connecting the loop coupling resistance ($R_{aEKE}$) to the ground terminal (PE), comprising:

superposing an excitation voltage ($U_{gEKE}$) by means of the excitation voltage source ($U_{gEKE}$), detecting and filtering a loop measuring voltage ($U_{mEKE}$) by means of the test and filter circuit (12), evaluating the loop measuring voltage ($U_{mEKE}$) and computing the ground resistance ($R_{EKE}$) by means of the microcontroller (14).

8. The measuring method according to claim 7, wherein a bipolar square wave voltage having a base frequency ranging from 0.1 Hz to 10 Hz and a voltage change less than 10 V is superimposed as excitation voltage ($U_{gEKE}$).

9. The measuring method according to claim 8, wherein the voltage changes of the excitation voltage ($U_{gEKE}$) and the loop measuring voltage ($U_{mEKE}$) in the test and filter circuit (12) and the microcontroller (14) is used to compute the ground resistance ($R_{EKE}$).

* * * * *